United States Patent
Bianca et al.

[11] Patent Number: 5,957,739
[45] Date of Patent: Sep. 28, 1999

[54] CONTINUOUS ELECTRONIC STAMPING WITH OFFSET CARRIER

[75] Inventors: Giuseppe Bianca, Temecula; Robert M. Bogursky, Encintas, both of Calif.

[73] Assignee: Autosplice Systems Inc., San Diego, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/843,241

[22] Filed: Apr. 14, 1997

Related U.S. Application Data

[63] Continuation-in-part of application No. 08/584,534, Jan. 11, 1996, Pat. No. 5,706,952, and application No. 08/751,030, Nov. 15, 1996, Pat. No. 5,749,458.

[51] Int. Cl.⁶ ..................................................... H01R 9/09
[52] U.S. Cl. ............................................ 439/885; 439/876
[58] Field of Search .................................... 439/885, 886, 439/83, 876

[56] References Cited

U.S. PATENT DOCUMENTS

| | | | |
|---|---|---|---|
| 2,748,452 | 6/1956 | Pierce | 439/885 |
| 3,328,749 | 6/1967 | Kukla | 439/389 |
| 3,902,776 | 9/1975 | Williams et al. | 439/885 |
| 4,206,964 | 6/1980 | Olsson | 439/873 |
| 4,261,629 | 4/1981 | Reynolds et al. | 439/885 |
| 4,265,508 | 5/1981 | Chisholm | 439/885 |
| 4,428,642 | 1/1984 | Schwindt et al. | 439/885 |
| 4,679,318 | 7/1987 | Bright | 29/840 |
| 4,832,622 | 5/1989 | Zahn | 439/590 |
| 4,978,308 | 12/1990 | Kaufman | 439/83 |
| 5,445,528 | 8/1995 | Frantz | 439/79 |
| 5,451,174 | 9/1995 | Bogursky et al. | 439/83 |
| 5,586,915 | 12/1996 | Baker | 439/733.1 |
| 5,730,608 | 3/1998 | Legrady | 439/885 |

OTHER PUBLICATIONS

Research Disclosure, Kenneth Mason Publications Ltd, No. 31552, England, Jul. 1990.

*Primary Examiner*—Neil Abrams

[57] ABSTRACT

A continuous stamping of plated metal components, with carrier links between their ends, for surface mount soldering. A strip of components is formed which can be individually easily separated at severance regions between the adjacent components. The severance regions are located in the carrier links between the components. Preferably, the carrier links are offset upwardly from a solderable surface (20) of the components, or alternatively may be coplanar with such surface (FIG. 17). The carrier regions (21) that remain after severance may also serve as an overtravel stop during insertion of the component into a support. In a two-row embodiment (FIG. 10), the carrier regions (50, 52) are formed to be asymmetrical in order to increase spacing between pins. Advantages include: less material required, lower cost for selective plating, adjustable pin length in the die, flat stamping, tip plating for better electrical contact, and scrapless end product.

14 Claims, 4 Drawing Sheets

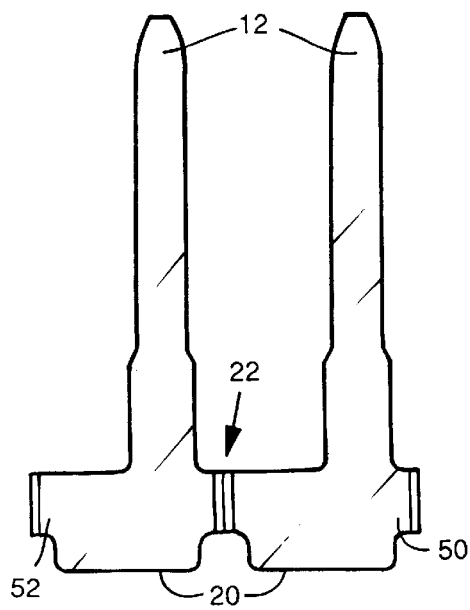
Fig. 12
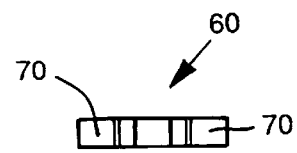
Fig. 14
Fig. 15    Fig. 13
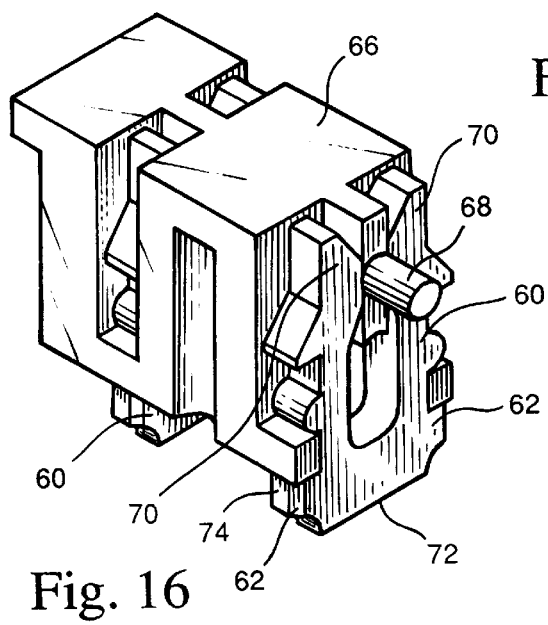
Fig. 16
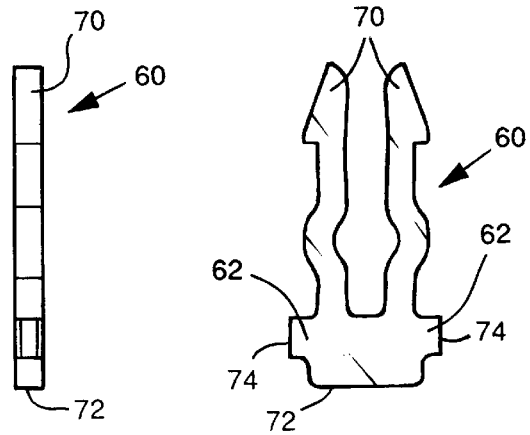
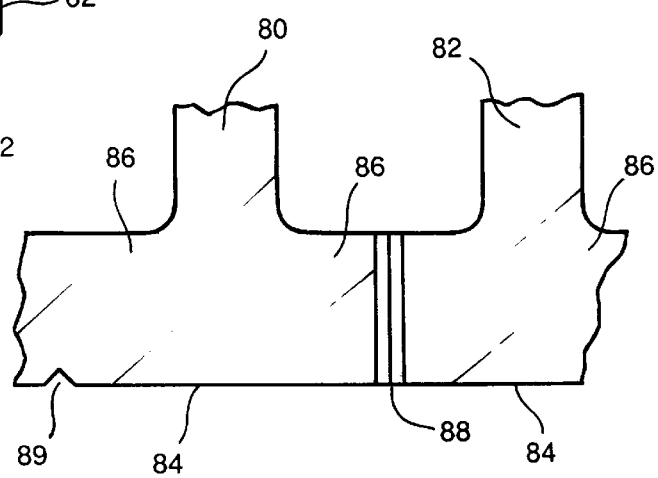
Fig. 17

CONTINUOUS ELECTRONIC STAMPING WITH OFFSET CARRIER

RELATED APPLICATIONS

This application is a continuation-in-part of a first commonly-assigned, patent application Ser. No. 08/584,534, filed Jan. 11, 1996 now U.S. Pat. No. 5,706,952.

This application is a continuation-in-part of a second commonly-assigned, patent application Ser. No. 08/751,030, filed Nov. 15, 1996, entitled "Miniature Jumper Switch With Wire Contact Maker", now U.S. Pat. No. 5,749,458.

This invention relates to the manufacture of continuous stamped electronic components for automatic assembly processes wherein the components are supported by carrier links whereby the linked components form a continuous strip from which one or more components can be severed during the assembly process to form a more complex structure.

BACKGROUND OF THE INVENTION

The first referenced copending application, whose contents are herein incorporated by reference, describes a continuous carrier for electrical or mechanical parts that is less expensive, sufficiently adjustable to accommodate electrical or mechanical components of any shape, size, or configuration, especially components designed for surface mounting on printed circuit boards (PCBs) or the like, and will work with either or both mechanical and pneumatic types of pick-and-place devices. The invention of that application uses an added flexible filament or strip for carrying, in one embodiment, a strip of electrical pin components, which allows the carried strip to be reeled up for subsequent processing.

The second referenced copending application, whose contents are herein incorporated by reference, describes a miniature switch in which in one embodiment uses a pair of electrically-conductive contact members which are shorted together by a wire when the housing-supported wire is pushed downward.

One way of fabricating such pins or switch contacts using surface mounting technology (SMT) for soldering to PCBs is by stamping, from an electrically-conductive blank of, for example, a copper alloy, a continuous strip of pins which are subsequently plated with a solderable finish, such as tin-lead or gold, especially over the solderable surface, to promote soldering to the pads on PCBs or a like substrate. By "solderable surface" is meant the surface of the component which engages and is soldered to a substrate using surface mount technology, as opposed to insertion in through-holes or blind holes of the substrate. One scheme for the manufacture of SMT pins or switch contacts by stamping leaves them in strip form interconnected at their tips by links as part of a continuous carrier strip. See, for example, U.S. Pat. No. 5,451,174. However, this method uses excess material as a carrier, which is subsequently discarded as scrap. Further, the carrier is in an undesireable location for selective plating of the pin tip which sometimes requires a precious metal coating. This coating is usually applied by dipping the end of the pin and carrier into a plating solution which deposits precious metal on the pin tips but also unnecessarily on the carrier which is later discarded.

SUMMARY OF THE INVENTION

An object of the invention is an improved construction and process for stamping of SMT electrical components in strip form for automatic feeding of the component and/or assembly wherein no scrap remains after one or more individual components have been separated from the strip.

Another object of the invention is an improved construction and process for stamping of SMT electrical components in strip form for automatic feeding of the component and/or assembly wherein virtually complete plating with a solderable finish is possible over at least every possible component surface that may need such a finish.

These and other objects of the invention are achieved, in accordance with one aspect of the present invention, by a component strip that comprises a plurality of components each having a solderable surface for SMT soldering to a PCB or the like and with the components linked together by a carrier link at or offset from the SMT solderable surface. Preferably, the carrier link of the SMT component is located between the component ends and offset from the SMT surface by a minimum amount that will space the link from the solderable surface. During assembly, the component or components are severed from the strip with the link portions remaining left in place. When such a strip of components has been pre-plated with a solderable finish, the severed or cut link end will be unplated. However, in the preferred embodiment, by locating the link above the solderable surface, the component does not need a further plating operation, since the link no longer performs an electrical function, such as carrying current or making electrical contact for which clean corrosion-free surfaces are desired.

In accordance with a further aspect of the present invention, the link is located not only so as not to interfere with the subsequent assembly of the component, but also to perform an important mechanical function in the resultant assembly, such as, for example, to act as a stop for positioning the component in the assembled product.

A further important benefit of the invention is that a flat stamping process can be used for stamping the plurality of electrical components in strip form for automatic feeding of the component and/or assembly wherein the carrier links are configured such that no scrap remains after the components with attached link portions have been separated from the strip during the assembly process.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

SUMMARY OF THE DRAWINGS

In the drawings:

FIG. 12 is a view similar to FIG. 1 of another form of stamped strip of pin connectors in accordance with the invention;

FIGS. 13, 14, and 15 are front elevational, top, and side views of a contact member for use in a switch which can be fabricated in accordance with the invention;

FIG. 16 illustrates a switch containing a contact similar to that illustrated in FIG. 13;

FIG. 17 is a partial elevational view of a modification.

DETAILED DESCRIPTION OF PREFERRED EMBODIMENTS

Figure 7:
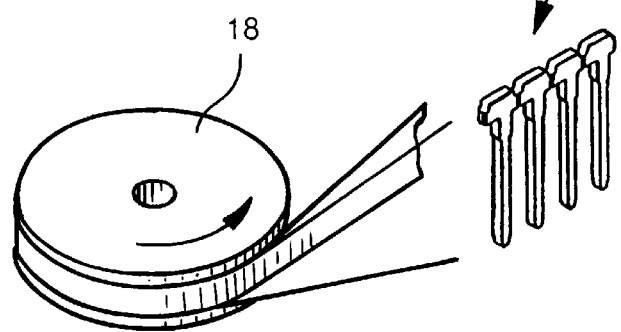
FIG. 7 illustrates how the strip of pins of FIG. 1 can be wound and unwound from a reel.
Figure 9:
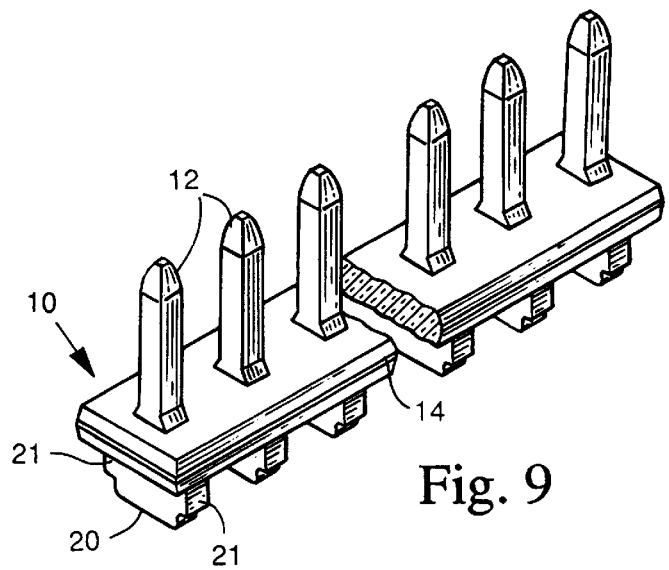

One form of assembled component that can use the invention is illustrated in FIG. 9. It comprises an SMT electrical pin header 10 comprising a plurality of in-line electrically-conductive metal pins 12 mounted in an electrically-insulating support 14. The pins can be inserted in the support at very high rates by commercially available insertion machines such as that manufactured by Autosplice Inc. of San Diego, Calif. under AC and CC Model Nos. Such machines operate with a strip 16 of the pins wound on a reel 18 as illustrated in FIG. 7. The machine automatically unreels the strip 16, separates the leading pin from the strip, and inserts it into the insulator 14 to produce the pin header assembly 10. A stamped strip 16 of the pins 12 is shown in FIGS. 1–5. Each pin 12 comprises, in this example, four distinct regions. The first region is termed the solderable region 20 which will ultimately be SMT soldered to an electrical contact area or pad and thus requires that it possess a solderable finish, by which is meant one of the well-known finishes used to enhance soldering, such as tin-lead or gold. The second region is the carrier region 21, what remains of a carrier link 22 which connects together adjacent pins and is integral with the pins, having been part of the original metal strip from which the component 16 was stamped. Some of the carrier links 22 (in this embodiment all of the links) are provided with severance means, such as a notch 24, forming weakened regions 25 where the pins can easily be severed from the strip leaving behind the carrier regions 21 attached to each pin. The third region is the press-fit region 24 which is the pin part inserted in a press-fit relationship in a hole in the insulator 14. The fourth region is the pin-engagement region 26 which is designed to interface and connect with another device, such as a socket or connector.

U.S. Pat. No. 4,832,622 illustrates various pin header configurations that can utilize the invention and available from a continuous strip of insulating material with holes filled by insertion machines with contact elements.

Figure 1:
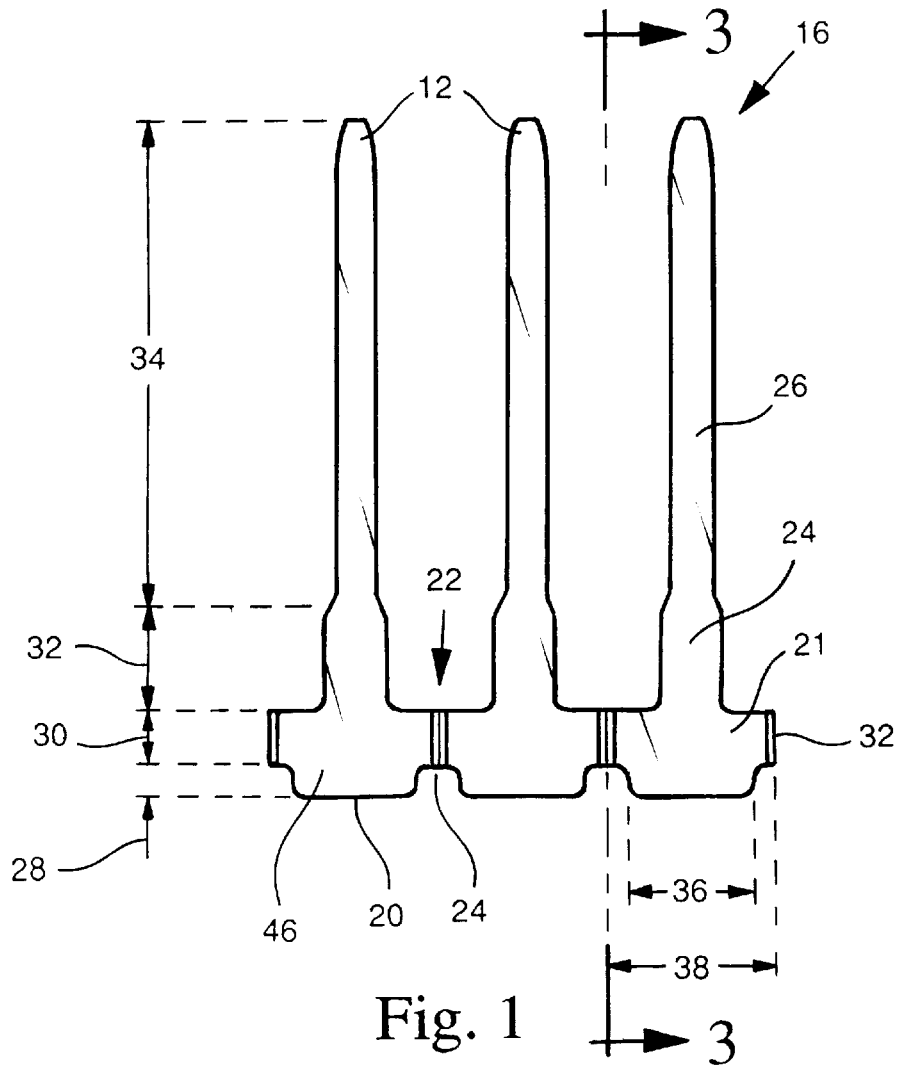
FIGS. 1 and 2 are front elevational and bottom views, respectively, of one form of stamped strip of pin connectors in accordance with the invention.

For the embodiment shown in FIG. 1, the various regions preferably satisfy the following requirements. The first solderable region 20, preferably approximately 0.01 to 0.06 inches high (the vertical dimension indicated at 28 in FIG. 1), requires plating 100% around its periphery, and is sized for providing satisfactory mechanical/electrical properties. The soldered area should also be large enough to withstand without damage reasonable mechanical loads imposed by connectors. The second carrier region 21 as part of the carrier link is given a height (the vertical dimension indicated at 30 in FIG. 1) sized for its ability to stabilize the pins during manufacturing, plating, and placement. The second region 21 does not require plating on the cut surface 32 remaining on each individual pin after separation from the strip, since in the preferred embodiment shown it is raised (spaced) from the soldering area at the bottom. The press fit region 24 is optional and can be omitted if the part is not press-fitted into another element such as in the embodiment of FIG. 9. However, when required, this region is sized to attain the appropriate pin retention forces (i.e., pull-out force) for the assembly. The pin engagement region 26 is designed to interface/connect with other items (i.e., a mating connector, a second PCB, etc.). It can have a square cross-section as in FIG. 5, or a rectangular cross section, as well as be U shaped to create a tuning fork style socket as described in the second referenced copending application. The pin tips 26 can be positioned symmetrically such that a "T" shape (FIG. 1), or unsymmetrically such that an "L" shape (FIG. 12), is formed. Similarly, a pin at an angle can also be made.

A feature of the preferred embodiments of the invention is the proximity of the carrier regions 21 to the base 46 of the pin. The carrier region 21 is preferably positioned approximately 0.01 to 0.06 inches from the solderable surface 20 as shown at 28 in FIG. 1. This spacing allows the pin to be held by the insertion machine, cut-off from the carrier strip and inserted into the insulator 14 without having to change the held position of the pin. In other words, the part of the pin 24, 26 above the carrier regions 21 is sufficiently large that it can be held by the insertion machine head during the separation step and while continuing to be held in that position it can be inserted in the insulator 14.

Figure 8:
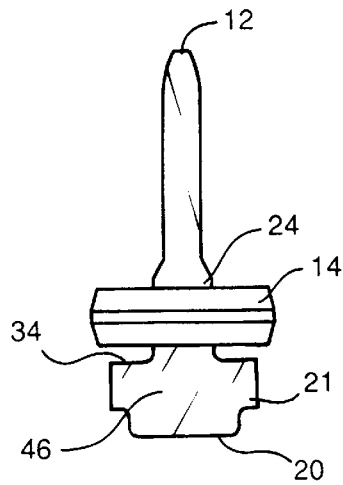
FIGS. 8 and 9 are end and perspective views, respectively, of individual pins from the strip of FIG. 1 after separation and assembly into a single row header.

The carrier regions 21 that remain after severance can be integrated with the component or assembly design, and can be used among other things as an overtravel stop, to keep the component from being inserted too deep into its support. For example, in the pin header 10 illustrated in FIG. 8, the top 34 of the carrier region 34 can serve as a stop to prevent the pin from being pushed too deep into the insulator 14.

Figure 5:
FIGS. 4 and 5 are cross-sectional views of the connector pin of FIG. 3 taken along the lines 4—4 and 5—5, respectively.
Figure 4:
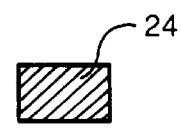
Figure 6:
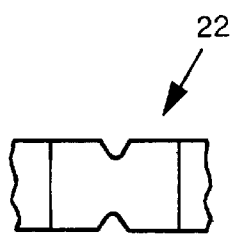
FIG. 6 is an enlarged view of the separation region between pins of the strip of FIG. 1.

The pins 12 have a substantially square cross section as shown in FIG. 5, or alternatively may be of a different cross-section, such as rounded or rectangular, and also may have an expanded "star" section in the area covered by the plastic insulator for interference-fitting with the insulating plastic, printed circuit board, ceramic substrate, or any other type of device that may be surface mount soldered to prevent longitudinal displacement of the inserted pins. The carrier links 22 formed by adjacent carrier regions 21 of the strip 16, between the pins, have the notches 24 formed therein, which notches are substantially U-shaped. The U-shaped notches 24 are directed substantially parallel to the longitudinal axis of the pin 12. By severing the strip 16 at the two opposing notches 24, an electrical connector having a predetermined number of pin terminals can be formed. To complete the description, as one example which is not to be considered limiting, the height 32 of the press-fit region can be approximately 0.045 inches, and the length 34 of the engagement fit region can vary between approximately 0.12 and 0.25 inches. The width 36 of the solderable surface can be approximately 0.06 inches, and the distance 38 between the notches of the carrier regions can be approximately 0.08 inches.

Figure 2:
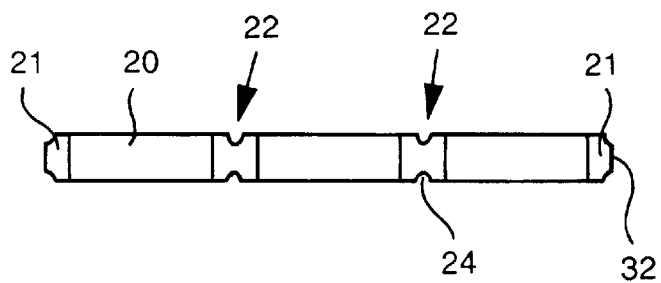
Figure 3:
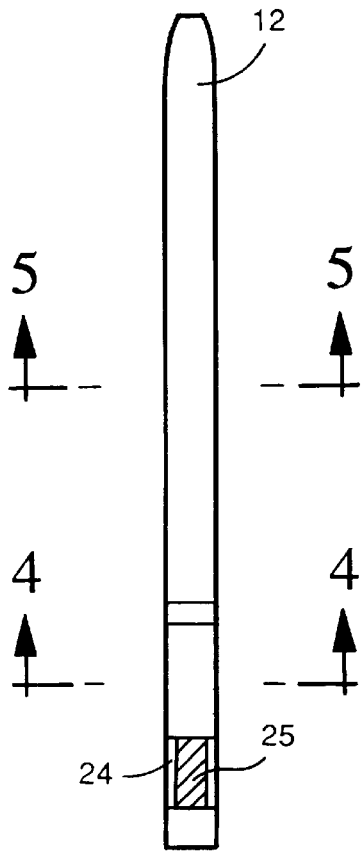
FIG. 3 is a cross-sectional side view of the strip at a separation region of the connector strip along the line 3—3 in FIG. 1.
Figure 10:
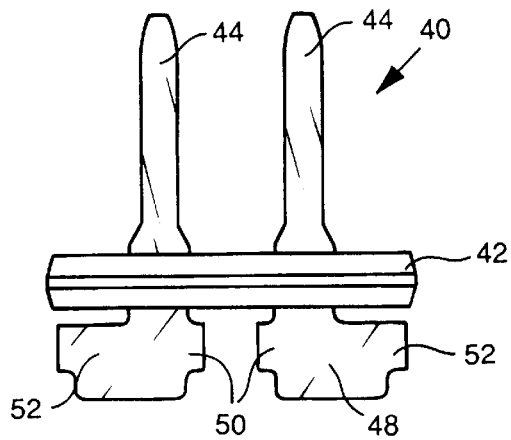
FIGS. 10 and 11 are views similar to FIGS. 8 and 9, respectively, of a dual row header using pins separated from a strip configured as illustrated in FIG. 12.
Figure 11:
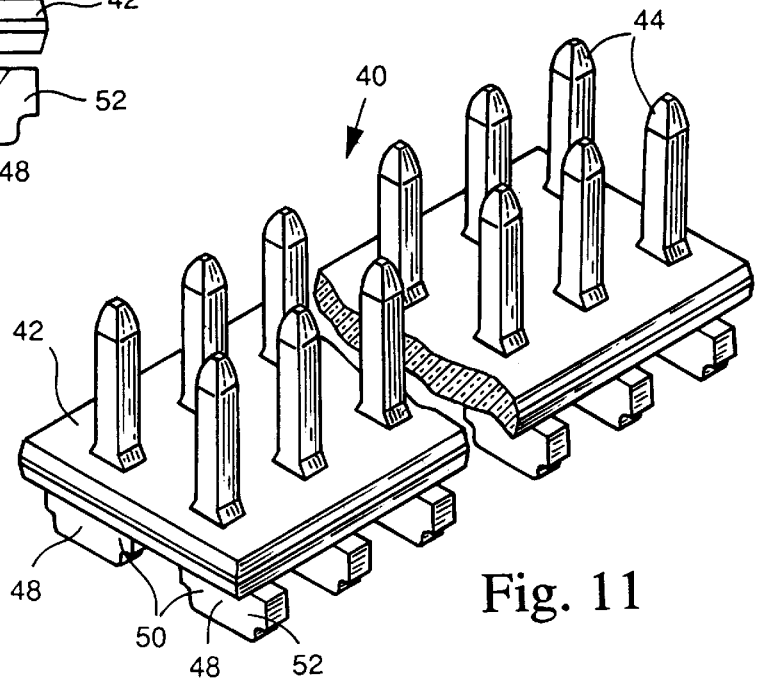

While the method of the invention has so far been described in connection with the manufacture of a single-row connector 10, other connectors, such as the dual row shown in FIGS. 10 and 11, can also be manufactured in accordance with the invention. In the dual-row pin header 40 according to the invention of FIGS. 10 and 11, a common insulator 42 is present for supporting the twin rows of pins 44. One important difference with the single row configuration is the configuration of the pin base. In FIGS. 1 and 2, the pin base 46 is generally T-shaped, with equal-sized carrier regions 21 at opposite sides. In the single row arrangement of FIG. 9, the regions 21 are sized to fit under the width of the insulator 14, providing the minimum footprint. In the dual row arrangement of FIG. 11, a different-shaped pin base 48 is needed, in this case, a generally L-shaped base with asymmetrical sized carrier regions, smaller 50 and larger 52. By locating the smaller regions 50 on the inside, as shown in FIG. 11, the gap between pins can be maintained to electrically separate the two pins while maintaining a reasonably sized solder foot for stability and solder strength. The overall width of the asymmetrically-sized carrier regions 50, 52 can be the same as in the FIG. 1 embodiment.

The method according to the invention is not limited to the formation of continuous strips of straight pin headers. FIGS. 13–15 show the configuration of SMT switch contacts that can be manufactured by a similar process, in that each of the tuning fork style contact members 60 is provided with carrier regions 62 forming portions by which they can be connected together to form links of a continuous strip of contacts in the same manner as the pin strip of FIG. 7. A strip of contact members 60 similar to that of FIG. 7 can be made by stamping from a metal strip of a suitable contact metal. The resultant contact strips 60, when separated from the strip, can be used in a switch assembly as illustrated in FIG. 16 and described in greater detail in the second referenced copending application. In brief, an insulator housing 66, mounted on a pair of the contacts 60, carries a contact wire 68 which when the housing is placed in its down position as shown comes into contact with the respective tines 70 of each contact thereby interconnecting the contacts 60 and thus contact pads of a PCB substrate to which each of the contacts would be soldered by their bottom contact surfaces 72. As with the pin configurations, the location of the carrier regions 62 above the solderable surface 72 means that the cut ends 74 do not have to be plated with a solderable finish. In addition, as shown in FIG. 16, the carrier regions 62 can be used as stops to prevent the housing 66 from being over-pushed down into contact with the underlying substrate.

Among the benefits of the invention are: (1) a continuously stamped surface mount device, with an offset carrier, which creates a scrapless package, to permit automatic feeding of the component and/or assembly; (2) a surface mount footprint which permits 100% solderable plating coverage; (3) a scrapless process of producing continuously stamped parts, for ease of automation (no separate carrier strip or secondary packaging is required); (4) a carrier located such that it does not interfere with the assembly of the product and can be integrated with the finished product (i.e., the carrier region is a functional part of the end product); (5) an enlarged press-fit region which improves product reliability by reducing abrasion or hole damage during insertion of the component; (6) a press-fit region which protects the engagement region of the pin from being damaged due to scraping off of the plating during assembly; (7) a footprint that can be either "T" shaped or "L" shaped or angle-shaped and lies under the support or housing thereby not consuming valuable board real estate; (8) a symmetrically balanced pin header or any other device which can stand on its own during the soldering cycle without additional support features.

Although the preferred component strips shown are provided with pin terminals or contacts, it is apparent that an electrical assembly can be manufactured according to the invention having any type of electrical components derived from a continuous strip of the components.

As shown in FIG. 7, the resultant strip 16 can be wound up in a continuous fashion on a reel 18 for distribution to a user as a reeled package. From the reel 18, the user at a PCB manufacturing station can unreel the strip 16 either manually or automatically by machine and as described sever sections with the desired number of components for mounting onto a support PCB, or ceramic substrate, or housing by an insertion machine.

It will also be appreciated that other structures capable of weakening the strip along discrete lengths thereof, for easy separation of the strip at the weakened regions, can be substituted for the notches 24. A further example is a score line where separation is desired.

The preferred embodiments position the carrier link offset from the solderable surface of the SMT component. It is also possible for the carrier link to be positioned at the solderable surface of the SMT component. This is illustrated in FIG. 17. Two components 80, 82, which may be pins, are shown in part with their solderable surfaces 84 at the bottom. In this embodiment, the connecting links 86 to form a continuous strip extend down to and are flush with the solderable surfaces 84. Score lines for separation are shown at 88. Alternative separating means in the form of a notch are shown at 89. The notch offers the advantage that the plating can extend also up into the notch to promote soldering. While the embodiment of FIG. 17 does not possess all of the benefits of the other embodiments, it still has the advantages, compared with, for example, the tip connected pin embodiment disclosed in U.S. Pat. No. 5,451,174, of less material required, lower cost for selective plating, adjustable pin length in the die, flat stamping, tip plating for better electrical contact, and scrapless end product.

While the invention has been described in conjunction with specific embodiments, it will be evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. An electrical assembly comprising:
    a) a housing having an electrically-insulating portion,
    b) a plurality of spaced electrically-conductive SMT contacts having ends and mounted in the electrically-insulating housing portion such that they can be electrically separated, each of the contacts comprising a stamped member having one end projecting externally of the housing and an opposite end, said one end of each of the contacts having a flat narrow edge coated with a solderable material adapted for soldering to a substrate, each of said contacts having flanking carrier regions extending sideways and located at a position offset from and spaced away both from the said one end and the said opposite end,
    c) the flat edges of all of the contacts extending substantially in the same plane whereby the assembly can be self-supported by the plurality of contact flat edges on a common substrate surface and all of the contact edges can be soldered by surface mounting to the same substrate surface without the offset carrier regions contacting the substrate surface to minimize the assembly footprint.

2. The electrical assembly of claim 1, wherein the portion of the member having one end projecting externally of the housing being flat and planar.

3. An electrical assembly comprising:

a) a housing having an electrically-insulating portion, b) a plurality of spaced electrically-conductive SMT contacts having ends and mounted in the electrically-insulating housing portion such that they can be electrically separated, each of the contacts comprising a stamped member having one end projecting externally of the housing and an opposite end, said one end of each of the contacts having a flat narrow edge adapted for soldering to a substrate, each of said contacts having flanking carrier regions extending sideways and located substantially in the plane of said one end and at a position offset from and spaced away both from the said one end and the said opposite end but being closer to the said one end than to the said opposite end, said carrier regions having severed ends extending generally transverse to the flat edge of its contact, c) a coating of a solderable material over the flat narrow edge of each contact, the cut ends of the carrier regions being free of the solderable material coating, d) the flat edges of all of the contacts extending generally in the same plane whereby the assembly can be self-supported by the plurality of contact flat edges in butt-edge contact on a common substrate surface and all of the contact edges can be soldered by surface mounting to form butt joints on the same substrate surface without the offset carrier regions contacting the substrate surface to minimize the assembly footprint.

4. The electrical assembly of claim 3, wherein the portion of the member having one end projecting externally of the housing being flat and planar, the solderable material coating all the surfaces of each contact except for the cut ends of the carrier regions.

5. An electrical assembly as claimed in claim 3, wherein each of the contacts has a longitudinal dimension, the carrier regions extend transverse to the longitudinal dimension, and the flat edge has a planar portion extending substantially parallel to the carrier regions.

6. The electrical assembly of claim 5, wherein the carrier regions are spaced from the flat edge by a distance of approximately 0.01–0.06 inches.

7. The electrical assembly of claim 6, wherein the contacts are of metal comprised of a copper alloy plated with a solderable finish.

8. The electrical assembly of claim 6, wherein the carrier regions form with the flat edge a generally T-shape or L-shape or angle-shape.

9. The electrical assembly of claim 3, wherein the contact comprises a member having a press-fit region located on the side of the carrier regions opposite to the flat edge, and an engagement region on the side of the press-fit region opposite to the carrier regions.

10. The electrical assembly of claim 9, wherein the press-fit region is wider than the pin engagement region.

11. The electrical assembly of claim 9, wherein the member comprises a pin.

12. The electrical assembly of claim 5, the carrier regions are configured to be asymmetrical in length to increase contact spacing.

13. An electrical system comprising:

a) a substrate having electrically-conductive areas on a surface, b) an assembly surface mounted on the substrate surface, said assembly comprising:

i) a housing having an electrically-insulating portion, ii) a plurality of spaced electrically-conductive SMT contacts having ends and mounted in the electrically-insulating housing portion such that they can be electrically separated if desired, each of the contacts comprising a stamped member having one end projecting externally of the housing and an opposite end, said one end of each of the contacts having a flat narrow edge adapted for soldering to the substrate surface, each of said contacts having flanking carrier regions having severed ends extending sideways and located generally in the plane of and at a position offset from and spaced away both from the said one end and the said opposite end, iii) a coating of a solderable material on at least the flat narrow edges of the contacts, the severed ends of the carrier regions being free of the coating, iv) the flat edges of all of the contacts extending generally in the same plane and being soldered by surface mounting to the electrically-conductive areas of the substrate surface without the offset carrier regions contacting the substrate surface to minimize the assembly footprint on the substrate.

14. The electrical assembly of claim 13, wherein the portion of the member having one end projecting externally of the housing being flat and planar, the solderable material coating all the surfaces of each contact except for the cut ends of the carrier regions.

\* \* \* \* \*